United States Patent
van Rhijn

(10) Patent No.: US 6,693,488 B1
(45) Date of Patent: Feb. 17, 2004

(54) APPARATUS AND METHOD FOR A FAST BANDWIDTH SWITCHING CIRCUIT IN A POWER AMPLIFIER CONTROL CIRCUIT

(75) Inventor: Arie J. van Rhijn, Wassenaar (NL)

(73) Assignee: National Semiconductor Corporation, Santa Clara, CA (US)

( * ) Notice: Subject to any disclaimer, the term of this patent is extended or adjusted under 35 U.S.C. 154(b) by 10 days.

(21) Appl. No.: 09/946,289

(22) Filed: Sep. 4, 2001

(51) Int. Cl.[7] .............................. H03G 3/20; H04B 1/04
(52) U.S. Cl. ..................... 330/129; 330/141; 455/126
(58) Field of Search ......................... 330/129, 141, 330/281; 455/126

(56) References Cited

U.S. PATENT DOCUMENTS

| | | | | |
|---|---|---|---|---|
| 5,369,789 A | * | 11/1994 | Kosugi et al. | 455/126 |
| 5,469,115 A | * | 11/1995 | Peterzell et al. | 330/129 |
| 5,642,075 A | * | 6/1997 | Bell | 330/129 |
| 6,307,429 B1 | * | 10/2001 | Olgaard | 330/2 |

* cited by examiner

*Primary Examiner*—Khanh Van Nguyen
(74) *Attorney, Agent, or Firm*—Merchant & Gould PC; Joshua W. Korver

(57) ABSTRACT

An apparatus and method is directed to a power amplifier control circuit that includes a bandwidth switching circuit. The power amplifier control circuit can be used in a GSM EDGE system for controlling the output power of a communication signal. The loop bandwidth of the power amplifier control circuit is high during ramp-up and ramp-down of the output power, and low during transmission of the communication signal. The power amplifier control circuit regulates the output power during power ramping, while preserving the amplitude modulation portion of the communication signal during transmission. The bandwidth switching circuit includes a pair of capacitance circuits that are arranged such that both capacitance circuits charge without affecting the loop bandwidth. The bandwidth switching circuit operates at high speeds associated with a GSM EDGE system, while avoiding transient glitches that may occur due to charging and discharging in the capacitance circuits.

20 Claims, 3 Drawing Sheets

APPARATUS AND METHOD FOR A FAST BANDWIDTH SWITCHING CIRCUIT IN A POWER AMPLIFIER CONTROL CIRCUIT

FIELD OF THE INVENTION

The present invention relates to the field of communication circuits, and in particular, to a bandwidth switching circuit in a power amplifier control circuit.

BACKGROUND OF THE INVENTION

Communication circuitry and standards are often changing to compliment innovations in the communications industry. One set of standards is based upon the Global System for Mobile communications (GSM). GSM is a digital cellular communications system that has been generally accepted worldwide. The aim of GSM specifications is to describe the functionality and the interface for each component of the system, and to provide guidance on the design of the system. GSM is a Time Division Multiple Access system (TDMA). TDMA involves dividing a single frequency communication channel into a number of timeslots. Each user or communication device utilizes only one out of every few timeslots. First, a small amount of the communication signal from one user is transmitted, and then a second user, and so on until all users on one channel have transmitted. Once all users have transmitted, the cycle repeats.

An example requirement under GSM specifications is that the spectral band utilized for transmission of the communication signal is kept relatively "pure". In other words, the output power of the communication signal cannot be turned on full, instantly, as this results in a broad spectrum signal when examined in the frequency domain. A broad spectrum signal can pollute the neighboring sidebands of other communication signals utilizing the same cell site. Therefore, the output power of the communication signal is accurately ramped up for transmission, and ramped back down under a controlled process. The purpose of the ramp up and down is to transmit the communication signal at a sufficient level without overdriving the signal. Overdriving the communication signal can cause interference with other signals utilizing the same cell site. The communication signal is often ramped up to an output power that is sufficient to transmit the signal given the distance of the user from the cell site. Transmitting the communication signal at a minimum level also limits power consumption.

Another innovation for GSM networks includes the EDGE system (Enhanced Data Rate for Global System for Mobile Communication Evolution). For EDGE, the data throughput in existing GSM networks has been increased by introducing a second modulation format into the GSM system. EDGE uses a format of 8-state phase-shift-keying (8PSK) modulation (3b/symbol) as opposed to the Gaussian minimum-shift-keying (GMSK) modulation format (1b/symbol). Where GMSK is a constant-envelope modulation format, 8PSK uses phase and amplitude modulation. This new format impacts the design of modulators, amplifiers, and regulators.

SUMMARY OF THE INVENTION

The present invention is directed to communication signal amplifier circuits. More particularly, the present invention is directed to a power amplifier control circuit that includes a bandwidth switching circuit. The power amplifier control circuit includes a control loop for providing a control signal to a power amplifier. A communication signal is amplified by the power amplifier in response to the control signal.

According to one aspect, the bandwidth switching circuit switches the loop bandwidth of the control loop according to a bandwidth switching signal. The bandwidth switching circuit includes two configurations: a high loop bandwidth configuration and a low bandwidth configuration. The high bandwidth configuration is selected when the output power is ramping-up and ramping down. The high loop bandwidth allows the control loop to regulate the output power of the communication signal. The low loop bandwidth configuration is selected when the communication signal is transmitted. The low loop bandwidth allows the amplitude modulation portion of the communication signal to be amplified and transmitted without suppression by the control loop. The bandwidth switching circuit is arranged such that the introduction of transient glitches are minimized when switching between the high bandwidth configuration and the low bandwidth configuration.

Briefly stated, an apparatus and method is directed to a power amplifier control circuit that includes a bandwidth switching circuit. The power amplifier control circuit can be used in a GSM EDGE system for controlling the output power of a communication signal. The loop bandwidth of the power amplifier control circuit is high during ramp-up and ramp-down of the output power, and low during transmission of the communication signal. The power amplifier control circuit regulates the output power during power ramping, while preserving the amplitude modulation portion of the communication signal during transmission. The bandwidth switching circuit includes a pair of capacitance circuits that are arranged such that both capacitance circuits charge without affecting the loop bandwidth. The bandwidth switching circuit operates at high speeds associated with a GSM EDGE system, while avoiding transient glitches that may occur due to charging and discharging in the capacitance circuits.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

Figure 1:
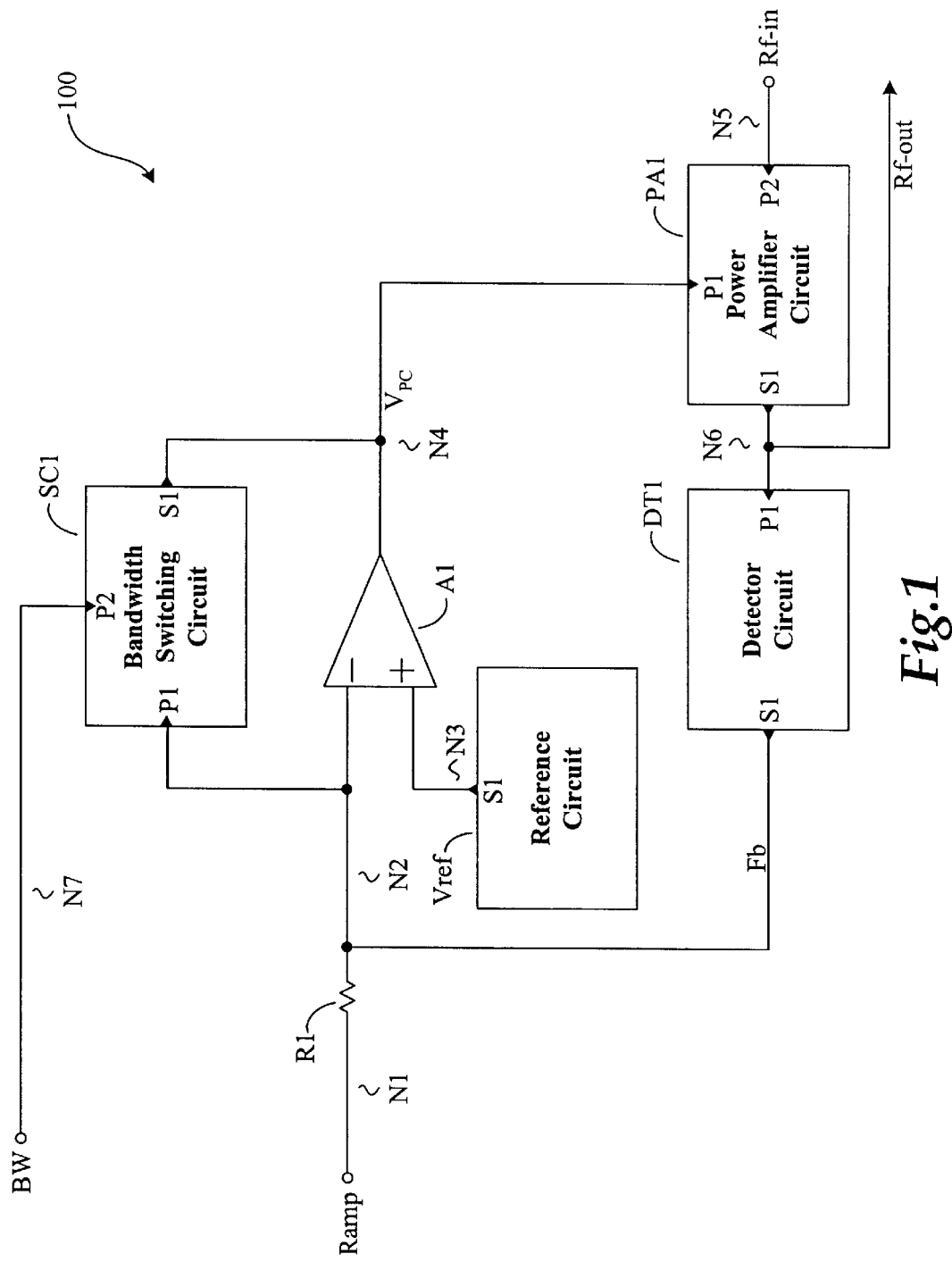
FIG. 1 is a schematic diagram illustrating an exemplary power amplifier control circuit.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal. The meaning of "a", "an", and "the" include plural references. The meaning of "in" includes "in" and "on".

The present invention generally relates to a power amplifier control circuit that may be used with an EDGE system (Enhanced Data Rate for Global System for Mobile Communication Evolution). The power amplifier control circuit is a closed-loop circuit that is arranged to reduce transient glitches. In an EDGE system, the communication signal includes both amplitude modulation and phase modulation. The amplitude modulation in the communication signal represents data. The present invention allows for closed-loop control of the output power without suppressing the amplitude modulation portion of the amplified communication signal.

The output power of the communication signal is accurately ramped up for transmission, and ramped back down under a controlled process. Hereinafter the ramp-up and ramp-down of the output power is referred to as power ramping. The communication signal is regulated during power ramping. In contrast, the communication signal is un-regulated during transmission.

In the present invention, the loop bandwidth associated with the closed-loop of the power amplifier control circuit is at a high bandwidth during power ramping of the communication signal. The loop bandwidth is switched by a bandwidth switching circuit to a low bandwidth for transmission of the communication signal. Switching the loop bandwidth to a low bandwidth avoids attenuating the amplitude modulation portion of the communication signal. The amplitude modulation portion has an associated signaling bandwidth. The loop bandwidth is lowered to a level such that the loop bandwidth is significantly different from the signaling bandwidth.

The bandwidth switching circuit of the present invention includes capacitive circuits. Transient glitches in the control signal may result from charging effects of certain capacitive circuits. However, in the present invention, the capacitive circuits are provided in a feedback loop, where a first capacitive circuit is also in a servo loop with a second capacitive circuit. The servo loop allows the second capacitive circuit to charge concurrently with the first capacitive circuit, without affecting the loop bandwidth. The servo loop provides a smooth transition when the second capacitive circuit is switched into the control loop of the power amplifier control circuit. The smooth transition prevents the occurrence of transient glitches in the control signal for the power amplifier. In addition, the present invention is capable of switching the loop bandwidth within a relatively short time period. Thus, the present invention provides a fast, transient bandwidth switching circuit that avoids transient glitches.

FIG. 1 is a schematic diagram illustrating an exemplary power amplifier control circuit. The power amplifier control circuit (100) includes a resistance circuit (R1), a control or integrator circuit (A1), a reference circuit (Vref), a power amplifier circuit (PA1), a detector circuit (DT1), and a bandwidth switching circuit (SC1).

The resistive circuit (R1) is coupled between node N1 and node N2. The control circuit (A1) includes an inverting input coupled to node N2, a non-inverting input coupled to node N3, and an output coupled to node N4. The reference circuit (Vref) includes an output (S1 coupled to node N3. The power amplifier circuit (PA1) includes a first input (P1) coupled to node N4, a second input (P2) coupled to node N5, and an output (S1 coupled to node N6. The detector circuit (DT1) includes an input (P1 coupled to node N6 and an output (S1 coupled to node N2. The bandwidth switching circuit (SC1) includes a first input (P1) that is coupled to node N2, a second input (P2) that is coupled to node N7, and an output (S1) that is coupled to node N4.

In operation, the power amplifier control circuit (100) controls the output power of a communication signal (Rf-out) while avoiding transient glitches in the power control signal ($V_{PC}$). A ramp signal (Ramp) is provided at node N1. The power amplifier control circuit (100) utilizes the ramp signal (Ramp) as a "mask" signal. The mask signal controls the power ramping of the communication signal (Rf-out). The output power of the communication signal (Rf-out) essentially tracks the ramp signal (Ramp) during power ramping such that the power is limited until the ramp signal (Ramp) reaches a predetermined level. Instantaneously reaching the full output power may cause a broad spectrum signal. A broad spectrum signal may pollute the sidebands of neighboring signals. Tracking the ramp signal (Ramp) with the output power avoids generating a broad spectrum signal since the output power remains proportional to the ramp signal (Ramp) during power ramping.

The reference circuit (Vref) provides a common mode signal to node N3 that corresponds to a nominal output power level for the communication signal (Rf-out). In one embodiment, node N3 is coupled to a potential such as ground in place of the reference circuit (Vref). The control circuit (A1) provides a power control signal ($V_{PC}$) to node N4 in response to the signals at node N2 and node N3. The power control signal ($V_{PC}$) is used to control the power amplifier circuit (PA1). The power amplifier circuit (PA1) produces the communication signal (Rf-out) in response to the power control signal ($V_{PC}$) and an input signal (Rf-in). The communication signal is produced with the output power level specified by the power control signal ($V_{PC}$). The detector circuit (DT1) detects the output power of the communication signal (Rf-out) and provides a feedback signal (Fb) to node N2. The signal at node N2 results from the combination of the ramp signal (Ramp) and the feedback signal (Fb).

During operation, a bandwidth switching signal (BW) is provided to node N7. The bandwidth switching circuit (SC1) switches the loop bandwidth of the power amplifier control circuit (100) in response to the bandwidth switching signal (BW). In one embodiment, the bandwidth switching signal (BW) is a digital signal having a low logic level (logic "0") and a high logic level (logic "1"). For example, in one instance, the loop bandwidth is at a high bandwidth when the bandwidth switching signal (BW) is at a low logic level, and the loop bandwidth is at a low bandwidth when the bandwidth switching signal (BW) is at a high logic level. The low bandwidth corresponds to a bandwidth level that is below a signaling bandwidth corresponding to the amplitude modulation portion of the communication signal (Rf-out). In one embodiment, the loop bandwidth of the power amplifier control circuit (100) is high during power ramping of the communication signal (Rf-out) and low during transmission of the communication signal. As an example, during power ramping, the loop bandwidth is approximately 200–300 kHz, while during transmission, the loop bandwidth is a few kHz (i.e., 1–3 kHz). Other ranges for a high loop bandwidth and a low loop bandwidth can be used as may be desired.

As previously stated, the power amplifier control circuit (100) suppresses amplitude modulation portion of the communication signal (Rf-out) during power ramping. The amplitude modulation portion is allowed to pass through the control loop and is reflected in the communication signal (Rf-out) during transmission. The control loop of the power amplifier control circuit (100) does not affect the communication signal (Rf-out) during transmission. Thus, the control loop essentially releases the communication signal (Rf-out) from regulation in response to the reduction in the loop bandwidth. During transmission, possibly for a few hundred microseconds, the output power of the communication signal (Rf-out) is unregulated and may begin to drop off. The drop off in this time period is small enough so that the integrity of the communication signal (Rf-out) is not degraded. Once transmission is complete, the loop bandwidth is returned to a high level in order to resume regulating the output power.

In one embodiment, the bandwidth switching circuit (SC1) is external to the power amplifier control circuit (100). This allows the bandwidth levels to be adjusted according to the how the power amplifier control circuit (100) is utilized. Often, power amplifier circuits have a different stability requirement, and having the bandwidth switching circuit (SC1) external to the power amplifier control circuit (100) allows the capacitance level to be customer selectable.

In another embodiment, the power amplifier circuit (PA1) is external to the power amplifier control circuit (100). This allows the amplification level of the communication signal (Rf-out) to be adjusted depending upon the application of the power amplifier control circuit (100).

In yet another embodiment, the resistance circuit R1 may be used in conjunction with capacitance circuits (not shown) to operate as first order filter for the ramp signal (Ramp). It is also appreciated and understood from the above discussion that other closed-loop configurations for the power amplifier control circuit (100) shown in FIG. 1 may be used.

A spike of noise can occur at the time interval the loop bandwidth is switched in some switching configurations. These "transient glitches" are caused by the charging characteristics of capacitance circuits used in conjunction with switching the bandwidth. A method and apparatus for avoiding the transient glitches is further described below in connection with FIG. 2.

Figure 2:
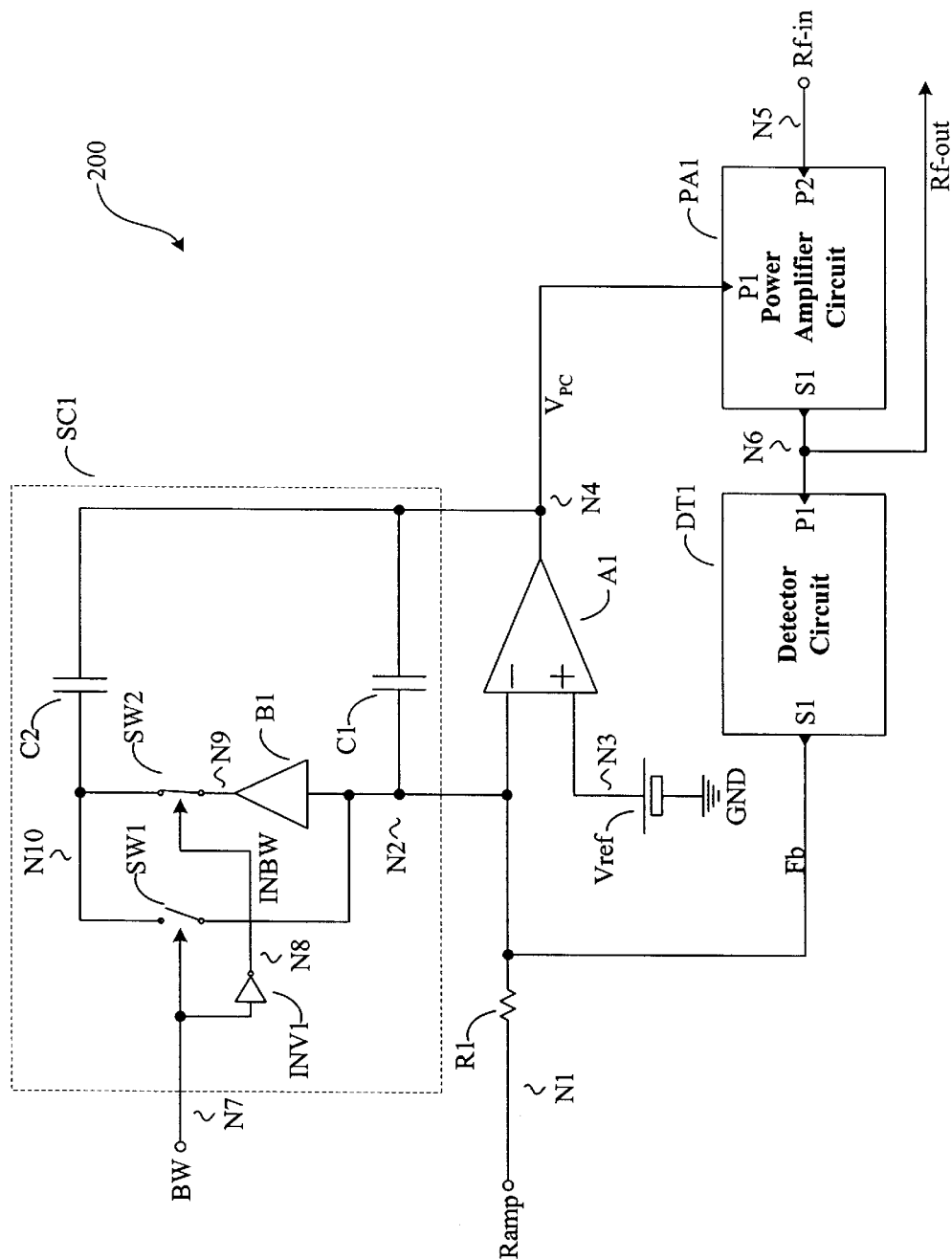
FIG. 2 is a schematic diagram illustrating an exemplary power amplifier control circuit in greater detail.

FIG. 2 is a schematic diagram illustrating an exemplary power amplifier control circuit in accordance with the present invention. The power amplifier control circuit (200) includes a resistance circuit (R1), a control or integrator circuit (A1), a reference circuit (Vref), a power amplifier circuit (PA1), a detector circuit (DT1), and a bandwidth switching circuit (SC1). The bandwidth switching circuit (SC1) includes a buffer circuit (B1), an inverter circuit (INV1), switch circuits (S1, S2), and capacitive circuits (C1, C2).

The resistive circuit (R1) is coupled between node N1 and node N2. The control circuit (A1) includes an inverting input coupled to node N2, a non-inverting input coupled to node N3, and an output coupled to node N4. The reference circuit (Vref) is coupled between node N3 and a ground terminal (GND). The power amplifier circuit (PA1) includes a first input (P1) coupled to node N4, a second input (P2) coupled to node N5, and an output (S1) coupled to node N6. The detector circuit (DT1) includes an input (P1) coupled to node N6 and an output (S1) coupled to node N2.

In the bandwidth switching circuit (SC1), the inverter circuit (INV1) is coupled between node N7 and node N8. The buffer circuit (B1) includes an input that is coupled to node N2 and an output that is coupled to node N9. Switch circuit SW1 is coupled between node N2 and node N10. Switch circuit SW2 is coupled between node N9 and node N10. Capacitance circuit (C1) is coupled between node N2 and node N4. Capacitance circuit (C2) is coupled between node N10 and node N4.

In operation, the power amplifier control circuit (200) operates similarly to the power amplifier control circuit (100) shown in FIG. 1. The operation of the bandwidth switching circuit (SC1) illustrated in FIG. 2 is described in detail below.

A bandwidth switching signal (BW) is provided to node N7. In one embodiment, the bandwidth switching signal (BW) is a digital signal. In this embodiment, the first switch circuit (SW1) closes in response to the transition of the bandwidth switching signal (BW) from a low logic level (logic "0") to a high logic level (logic "1"). The bandwidth switching signal (BW) is inverted by inverter circuit (INV1). The second switch circuit (SW2) opens when the inverted bandwidth switching signal (BW-N) changes from a low logic level (logic "0") to a high logic level (logic "1"). The two logic levels (logic "0", logic "1") of the bandwidth switching signal (BW) result in two configurations for the bandwidth switching circuit (SC1): a high loop bandwidth configuration and a low loop bandwidth configuration. Additionally, the bandwidth switching circuit (SC1) is arranged to avoid introducing the occurrence of transient glitches during transitioning between each configuration.

High Loop Bandwidth Configuration

In the high loop bandwidth configuration, the bandwidth switching signal (BW) is selected as a low logic signal (logic "0"). Switch SW1 is opened in response to the bandwidth switching signal (BW), while switch SW2 is closed. Capacitance circuit C1 is coupled to the control loop of the power amplifier control circuit (200). The actuation of switch SW2 results in capacitance circuit C2 being separated from the control loop by the buffer circuit (B1). Capacitance circuit C2 is charged to the same level as capacitance circuit C1 such that the potential at node N10 and node N2 are substantially the same.

The buffer circuit (B1) prevents capacitance circuit C2 from affecting the loop bandwidth of the control loop. The loop bandwidth of the control loop is inversely proportional to the capacitance value associated with the control loop. The loop bandwidth is a high bandwidth for this configuration since capacitance circuit C2 is not included in the control loop.

In one embodiment, the buffer circuit (B1) is a class A unity gain buffer that is configured to sink a large amount current (on the order of 1–5 mA) and source a small amount of current (on the order of 15–20 µA).

The loop bandwidth of the power amplifier control circuit (200) is at a high bandwidth during power ramping. The high bandwidth is in the range of the signaling bandwidth for the amplitude modulation portion of the communication signal (Rf-out). The loop bandwidth is maintained at a high bandwidth during power ramping so that the output power of the communication signal (Rf-out) is regulated. Regulating the output power during power ramping avoids possibly polluting sidebands of neighboring signals. Thus, the spectral band of the communication signal (Rf-out) is kept "pure" and a broad spectrum signal is avoided. However, the amplitude modulation portion of the communication signal (Rf-out) is attenuated while the loop bandwidth is at a high bandwidth.

Low Loop Bandwidth Configuration

In the low loop bandwidth configuration, the bandwidth switching signal (BW) is selected as a high logic signal (logic "1"). Switch SW1 is closed in response to the bandwidth switching signal (BW), switch SW2 is opened. The actuation of switch SW1 results in capacitance circuit C1 and capacitance circuit C2 being placed in parallel with respect to one another. The parallel combination of capacitance circuit C1 and capacitance circuit C2 are in a feedback loop of the power amplifier control circuit (200) such that a low loop bandwidth is formed. While the loop bandwidth is low, amplitude modulation of the communication signal (Rf-out) is possible without interference from the control loop.

In one embodiment, the capacitance value associated with capacitance circuit C2 is approximately 100 times larger than that of capacitance circuit Cl. The loop bandwidth of the control loop decreases in response to an increase in the total capacitance associated with capacitance circuit C1.

When the bandwidth switching signal (BW) transitions back from a high logic level to a low logic level, switch SW1 opens and switch SW2 closes. Capacitance circuit C2 is removed from the control loop. The capacitance level in the control loop is decreased such that the loop bandwidth increases. The power amplifier control circuit (200) is returned to the high loop bandwidth configuration.

Transient Operation

The bandwidth switching circuit (SC1) avoids transient glitches in the power control signal ($V_{PC}$) and the communication signal (Rf-out) by having capacitance circuit C2 in a servo loop with capacitance circuit C1. As previously stated, the buffer circuit (U1) allows capacitance circuit C2 to charge while preventing capacitive circuit C2 from affecting the loop bandwidth of the control loop. Since capacitance circuit C2 charges at the same time as capacitance circuit C1, there is no spike in the voltage or current when capacitance circuit C2 is switched into the control loop. When the switch occurs, capacitance circuits C1 and C2 are charged to the same level. Capacitance circuit C2 does not instantaneously attempt to charge to the capacitance level of capacitance circuit C1 in the present invention. Therefore, the power control signal ($V_{PC}$) is maintained with a smooth response, rather than experiencing transient glitches. The avoidance of transient glitches in the power control signal ($V_{PC}$) is described further in connection with FIG. 3.

In addition, the bandwidth switching circuit (SC1) of the present invention is capable of switching the loop bandwidth at a relatively fast speed. For example, in TDMA systems, the output power may have approximately 20 µs to ramp-up to a power level sufficient for transmitting the communication signal (Rf-out). Transmission of the communication signal (Rf-out) may occur 1–2 µs after the output power has settled to the sufficient power level. This requires a relatively fast response time for switching the loop bandwidth. The present invention provides a method and apparatus for fast bandwidth switching as previously described.

In an alternative embodiment, the inverter circuit (INV1) may be removed such that the second switch (SW2) opens in direct response to the bandwidth switching signal (BW). Also, the buffer circuit (B1) can include charging circuits other than the class A unity gain buffer previously mentioned. For example, a class AB unity gain buffer may be used to increase the response speed. The control circuit (A1) can also be specified as a particular type of circuit, such as an integration amplifier.

In another embodiment, additional switch circuits, capacitance circuits, and buffer circuits may be included in the bandwidth switching circuit (SC1). The additional circuitry may be used to provide additional loop bandwidths. For example, a bandwidth switching signal with an increased number of bits may be utilized to increase the number of switching combinations. A 3-bit bandwidth switching signal provides for eight loop bandwidths when used with additional switch circuits, capacitance circuits, and buffer circuits. Other switching combinations may be utilized by changing the number of bits for the bandwidth switching signal additional and the number of additional switch circuits, capacitance circuits, and buffer circuits.

Figure 3:
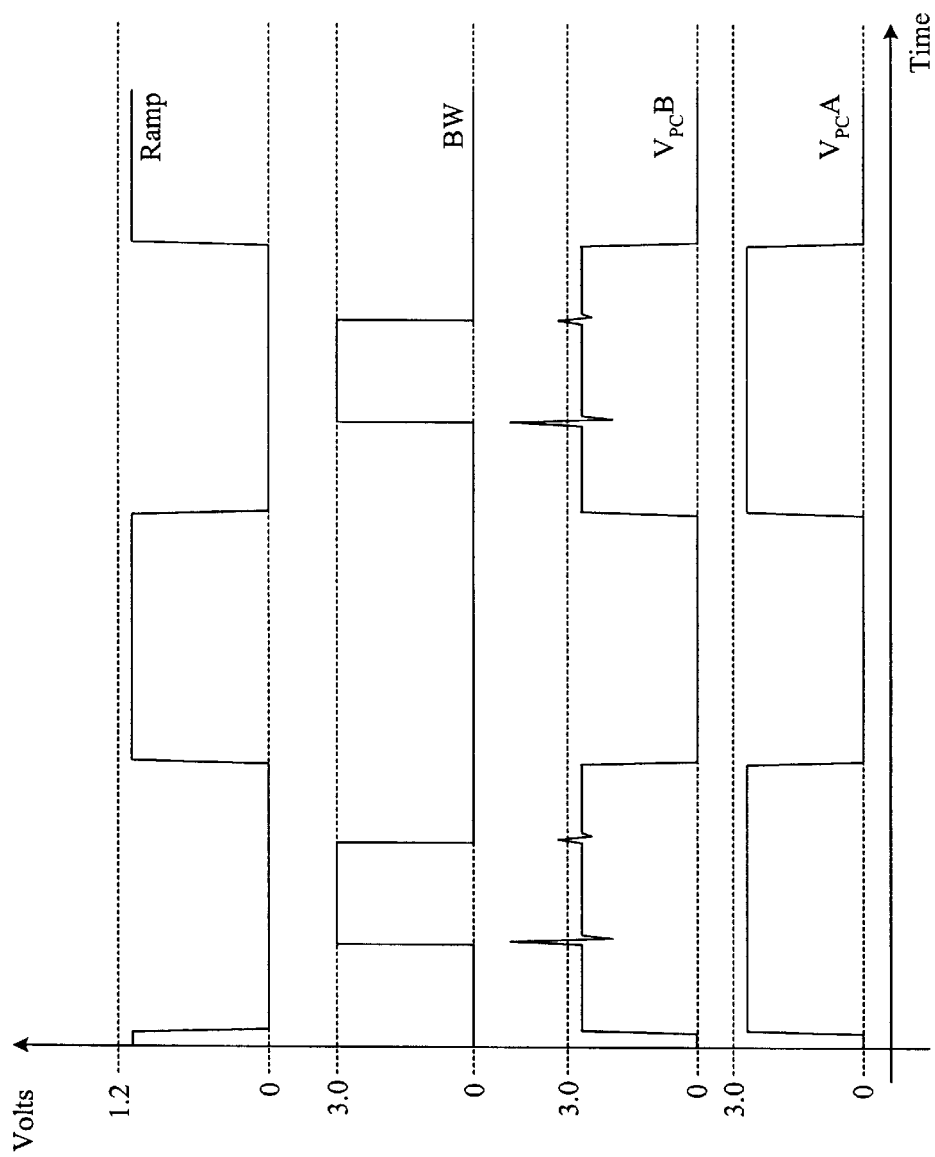
FIG. 3 is a graph illustrating exemplary waveforms for a power amplifier control circuit, in accordance with the present invention.

FIG. 3 is a graph illustrating exemplary waveforms for a power amplifier control circuit in accordance with the present invention. The graph includes an exemplary ramp signal (Ramp), bandwidth switching signal (BW), and a power control signal for the present invention ($V_{PC}A$) that correspond to the signals identified in FIG. 2. An exemplary power control signal corresponding to a power amplifier control circuit that is not configured according to the present invention ($V_{PC}B$) is also shown. The exemplary ramp signal (Ramp) is shown as having opposite polarity the power control signals ($V_{PC}A$, $V_{PC}B$) because in actual implementation of the present invention, the ramp signal (Ramp) is negative. However, it can be appreciated that another ramp signal (Ramp) other than the exemplary ramp signal (Ramp) may be used.

The difference between the power control signals ($V_{PC}A$, $V_{PC}B$) can be observed in FIG. 3. Power control signal $V_{PC}B$ illustrates transient glitches, shown as spikes in the voltage, at each transition of the bandwidth switching signal (BW). Power control signal $V_{PC}A$, which is generated in conjunction with the present invention has no transient glitches at the transition of the bandwidth switching signal (BW). The present invention is able to provide fast bandwidth switching while avoiding the presence of transient glitches. It is appreciated that the signals shown in FIG. 3 are for the purpose of illustration only, and that the voltage levels shown are not limiting to the invention.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for providing closed-loop control of an output power level that is associated with a communication signal, the apparatus comprising:
    a control circuit that is arranged to produce a control signal in response to a comparison between a feedback signal and a reference signal;
    a power amplifier circuit that is arranged to amplify an input signal according to the control signal and produce the communication signal;
    a detector circuit that is arranged to produce the feedback signal in response to detecting the output power level of the communication signal; and
    a bandwidth switching circuit that is arranged to select a loop bandwidth of the closed-loop between a high bandwidth for power ramping, and a low bandwidth for transmission of the communication signal.

2. An apparatus as in claim 1, wherein the control circuit is an integration amplifier.

3. An apparatus as in claim 1, wherein the power amplifier circuit is external to the apparatus such that the power amplifier circuit is customer selectable.

4. An apparatus as in claim 1, wherein the bandwidth switching circuit is external to the apparatus such that the bandwidth switching circuit is customer selectable.

5. An apparatus as in claim 1, the bandwidth switching circuit further comprising a first capacitance circuit and a second capacitance circuit that are selectively arranged in a feedback loop.

6. An apparatus as in claim 5, wherein the second capacitance circuit is approximately 100 times larger than the first capacitance circuit.

7. An apparatus as in claim 5, further comprising a switch circuit that is arranged so that the loop bandwidth is selected by selectively coupling one of the first and second capacitance circuits to a feedback loop with the control circuit.

8. An apparatus as in claim 1, wherein the loop bandwidth of the closed-loop is sufficiently below a signaling bandwidth associated with an amplitude modulation portion of the input signal when the loop bandwidth is selected.

9. An apparatus as in claim 1, wherein the bandwidth switching circuit operates fast enough to meet the timing requirements of a TDMA system.

10. An apparatus that is arranged to switch a loop bandwidth of a closed-loop power amplifier control circuit between a first bandwidth and a second bandwidth, the apparatus comprising:

a control circuit;

a first capacitance circuit that is coupled across the control circuit of the closed-loop, wherein the first capacitance circuit defines the first bandwidth;

a second capacitance circuit that is selectively coupled in parallel with the first capacitance circuit such that the first and second capacitance circuits define the second bandwidth;

a first switch circuit that is coupled between the first capacitance circuit and the second capacitance circuit, such that the second capacitance circuit is included in the closed-loop when the first switch circuit is closed; and a selectable charging circuit that is selectively coupled between the first capacitance circuit and the second capacitance circuit when the first switch circuit is open such that the second capacitance circuit is charged to the same potential as the first capacitance circuit.

11. An apparatus as in claim 10, the selectable charging circuit further comprising:

a buffer circuit; and a second switch circuit that is responsive to a bandwidth switching signal and is coupled between the second capacitance circuit and the buffer circuit, such that when the second switch is closed, the second capacitance circuit charges to the same potential as the first capacitance circuit without affecting the loop bandwidth and whereby transient glitches are minimized.

12. An apparatus as in claim 11, wherein the second capacitance circuit is approximately 100 times larger than the first capacitance circuit.

13. An apparatus as in claim 11, wherein a response time associated with the switch circuits and the capacitance circuits meets the timing requirements of a TDMA system.

14. An apparatus as in claim 11, further comprising an inverter circuit that is arranged to provide an inverse of a bandwidth switching signal that is utilized to control the second switch circuit.

15. An apparatus as in claim 10, wherein the second bandwidth is sufficiently below a signaling bandwidth associated with an amplitude modulation portion of a GSM EDGE system.

16. A method for providing closed-loop control of an output power level associated with a power amplifier that amplifies a communication signal, the closed-loop having an associated loop bandwidth, the method comprising:

switching the loop bandwidth to a high bandwidth during power ramping of the output power by decoupling one of a first and second capacitance circuit from the closed-loop, such that the output power level is regulated by the closed-loop;

switching the loop bandwidth to a low bandwidth during transmission of the communication signal by coupling the one of the first and second capacitance circuits to the closed-loop, such that the output power level is unregulated by the closed-loop and an amplitude modulation portion of the communication signal is amplified by the power amplifier; and buffering the one of the first and second capacitance circuits such that the first and second capacitance circuits are charged to the same potential when the loop bandwidth is the high bandwidth such that transient glitches associated with the high bandwidth and the low bandwidth are minimized.

17. A method as in claim 16, wherein regulation of the output power level further comprises detecting the output power level of the amplified communication signal such that the output power level is repeatedly adjusted during regulation.

18. A method as in claim 16, wherein switching the loop bandwidth further comprises:

closing a first switch circuit in response to a bandwidth switching signal when the high bandwidth is selected;

opening a second switch circuit in response to an inverse of the bandwidth switching signal to switch to a high bandwidth when the high bandwidth is selected;

opening a first switch circuit in response to a bandwidth switching signal when the low bandwidth is selected; and closing a second switch circuit in response to an inverse of the bandwidth switching signal to switch to a low bandwidth when the low bandwidth is selected.

19. An apparatus for providing closed-loop control of an output power level associated with a power amplifier that amplifies a communication signal, the closed-loop having an associated loop bandwidth, the apparatus comprising:

a first means for switching the loop bandwidth that is arranged to switch the loop bandwidth to a high bandwidth during power ramping of the output power level by decoupling one of a first and second capacitance circuit from the closed-loop, such that the output power level is regulated by the closed-loop;

a second means for switching the loop bandwidth that is arranged to switch the loop bandwidth to a low bandwidth during transmission of the communication signal by coupling the one of the first and second capacitance circuits to the closed-loop, such that the output power level is unregulated by the closed-loop and an amplitude modulation portion of the communication signal is amplified by the power amplifier; and a means for buffering that is aged to buffer the one of the first and second capacitance circuits such that the first and second capacitance circuits are charged to same potential when the loop bandwidth is the high bandwidth such that transient glitches associated with the high bandwidth and the low bandwidth are minimized.

20. An apparatus as in claim 19, wherein the loop bandwidth of the closed-loop is below a signaling bandwidth associated with an EDGE GSM system.

* * * * *

UNITED STATES PATENT AND TRADEMARK OFFICE
CERTIFICATE OF CORRECTION

PATENT NO. : 6,693,488 B1
DATED : February 17, 2004
INVENTOR(S) : van Rhijn

It is certified that error appears in the above-identified patent and that said Letters Patent is hereby corrected as shown below:

Column 4,
Lines 11, 14 and 16, please change "(S1" to -- (S1) --.
Line 15, please change "(P1" to -- (P1) --.

Column 7,
Line 24, please change "Cl" to -- C1 --.

Column 10,
Line 58, please change "aged" to -- arranged --.
Line 60, please change "charged to same" to -- charged to a same --

Signed and Sealed this

Twenty-seventh Day of July, 2004

JON W. DUDAS
*Acting Director of the United States Patent and Trademark Office*